United States Patent
Irie

(10) Patent No.: US 10,270,951 B2
(45) Date of Patent: Apr. 23, 2019

(54) IMAGE SENSING UNIT AND IMAGE CAPTURING APPARATUS

(71) Applicant: CANON KABUSHIKI KAISHA, Tokyo (JP)

(72) Inventor: Yoshiaki Irie, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/676,471

(22) Filed: Aug. 14, 2017

(65) Prior Publication Data
US 2018/0059361 A1  Mar. 1, 2018

(30) Foreign Application Priority Data
Aug. 23, 2016 (JP) .................. 2016-163036

(51) Int. Cl.
| | |
|---|---|
| H04N 5/225 | (2006.01) |
| G02B 7/34 | (2006.01) |
| H04N 5/232 | (2006.01) |
| H04N 5/369 | (2011.01) |
| H01L 27/146 | (2006.01) |
| H04N 5/3745 | (2011.01) |
| H04N 9/04 | (2006.01) |

(52) U.S. Cl.
CPC .......... H04N 5/2254 (2013.01); G02B 7/34 (2013.01); H04N 5/23212 (2013.01); H04N 5/3696 (2013.01); H01L 27/14625 (2013.01); H01L 27/14627 (2013.01); H04N 5/37455 (2013.01); H04N 9/045 (2013.01)

(58) Field of Classification Search
CPC .. H04N 5/2254; H04N 5/37455; H04N 9/045; H01L 27/14625; H01L 27/14627; G02B 7/34; G02B 7/343
See application file for complete search history.

(56) References Cited

U.S. PATENT DOCUMENTS

| | | | | |
|---|---|---|---|---|
| 2006/0256228 A1* | 11/2006 | Konno | .................. | G02B 27/46 348/335 |
| 2013/0221200 A1* | 8/2013 | Watanabe | .......... | G02B 27/0006 250/208.1 |
| 2013/0270421 A1* | 10/2013 | Kanamori | .............. | G02B 23/24 250/208.1 |
| 2014/0347549 A1* | 11/2014 | Nakamoto | ............... | G02B 7/36 348/349 |
| 2015/0301238 A1* | 10/2015 | Momoki | ................ | G02B 27/46 348/360 |

FOREIGN PATENT DOCUMENTS

| | | |
|---|---|---|
| JP | 2013-054121 A | 3/2013 |
| JP | 2014-228818 A | 12/2014 |

* cited by examiner

*Primary Examiner* — Lin Ye
*Assistant Examiner* — Chriss S Yoder, III
(74) *Attorney, Agent, or Firm* — Cowan, Liebowitz & Latman, P.C.

(57) ABSTRACT

An image sensing unit, comprising: an image sensor including a plurality of pixels, corresponding to a plurality of microlenses, respectively, each of which has a plurality of photoelectric conversion units aligned in a predetermined direction and from which a pupil divided signal can be read out; and an optical low-pass filter arranged on a subject side of the image sensor, wherein the optical low-pass filter is configured by a single birefringence plate, and separates a light beam in an alignment direction in which the plurality of photoelectric conversion units are aligned.

7 Claims, 5 Drawing Sheets

IMAGE SENSING UNIT AND IMAGE CAPTURING APPARATUS

BACKGROUND OF THE INVENTION

Field of the Invention

The present invention relates to an image sensing unit and an image capturing apparatus on which an image sensing unit is mounted.

Description of the Related Art

Conventionally, in image capturing apparatuses such as digital cameras, an optical filter having an optical low-pass filter and an infrared absorbing filter are arranged on a front surface of an image sensor. The optical low-pass filter suppresses the occurrence of a pseudo color according to a pseudo signal of a subject image in an image sensor such as a CCD, a CMOS sensor or the like. A quartz plate, for example, in which birefringence effects are employed is widely used as such an optical low-pass filter. Also, the infrared absorbing filter causes the sensitivity of the image sensor to approximate the visual sensitivity of a human.

Meanwhile, in an on-imaging plane phase difference focus detection, light fluxes that pass through different exit pupil regions of an image capturing optical system are received by a plurality of photoelectric conversion elements via microlenses arranged on the front surface of pixels of an image sensor. Then, based on a shift amount of signals outputted in accordance with the amount of received light, an amount to drive a lens necessary for focusing is derived to realize the on-imaging plane phase difference focus detection. The on-imaging plane phase difference focus detection is generally faster compared to focus detection by a contrast detection method which has been performed conventionally, and has the characteristic that it is possible to perform prediction control from movement of a subject.

Japanese Patent Laid-Open No. 2013-54121 discloses a relationship between an optical low-pass filter and an image sensor having an on-imaging plane phase difference focus detection function. In the image sensor described in Japanese Patent Laid-Open No. 2013-54121, some of the pixels that configure the image sensor are configured as focus detection pixels in pairs of two pixels. Because the focus detection pixels are not covered by color filters and have a narrower light-receiving region than pixels for capturing an image, it is not possible to use signals outputted from the focus detection pixels as signals for forming a captured image. Accordingly, information of the pixel regions of focus detection pixels is lost, and so it is necessary to generate the captured image by interpolating the lost information using pixels adjacent to the pixel region of the focus detection pixels.

In Japanese Patent Laid-Open No. 2013-54121, in response to this problem, a birefringent quartz plate is set so as to achieve a filtering effect, specifically a light beam separation, in a direction orthogonal to a direction in which a plurality of pixels for focus detection are aligned, in other words a vertical direction of the camera. Japanese Patent Laid-Open No. 2013-54121 discloses that by setting the birefringence quartz plate, subject information (luminance, color) of a pixel region of a focus detection pixel is included in adjacent pixels above and below the pixel region, and so it is possible to enhance the precision at which lost information is interpolated.

Meanwhile, in an image sensor described in Japanese Patent Laid-Open No. 2014-228818, two sub-pixels are formed in one pixel unit, and because the two sub-pixels are arranged so as to be respectively decentered in the +X direction and the −X direction from the center of the pixel unit, pupil division is possible using a single microlens. Furthermore, because two subpixel signals are used as captured image signals, phase-difference focus detection over the entire region of the image sensor is possible. Specifically, because there is no pixel dedicated to focus detection, there is no need to interpolate the pixel signal dedicated to focus detection using the optical low-pass filter effect as in Japanese Patent Laid-Open No. 2013-54121.

However, in Japanese Patent Laid-Open No. 2014-228818, the relationship between the optical low-pass filter characteristics and an image sensor in which one pixel is divided into two sub-pixels and each signal can be used for both the captured image and focus detection, and specifically whether pseudo color and pseudo resolution should be mitigated, is not made clear.

SUMMARY OF THE INVENTION

The present invention has been made in consideration of the above situation, and mitigates the influence of pseudo color and pseudo resolution of a signal outputted from a plurality of sub-pixels that configure each pixel, and thereby improves focus detection precision.

According to the present invention, provided is an image sensing unit, comprising: an image sensor including a plurality of pixels, corresponding to a plurality of microlenses, respectively, each of which has a plurality of photoelectric conversion units aligned in a predetermined direction and from which a pupil divided signal can be read out; and an optical low-pass filter arranged on a subject side of the image sensor, wherein the optical low-pass filter is configured by a single birefringence plate, and separates a light beam in an alignment direction in which the plurality of photoelectric conversion units are aligned.

According to the present invention, provided is an image capturing apparatus that comprises an image sensing unit comprising: an image sensor including a plurality of pixels, corresponding to a plurality of microlenses, respectively, each of which has a plurality of photoelectric conversion units aligned in a predetermined direction and from which a pupil divided signal can be read out; and an optical low-pass filter arranged on a subject side of the image sensor, wherein the optical low-pass filter is configured by a single birefringence plate, and separates a light beam in an alignment direction in which the plurality of photoelectric conversion units are aligned.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will be described in detail in accordance with the accompanying drawings.

Figure 1:
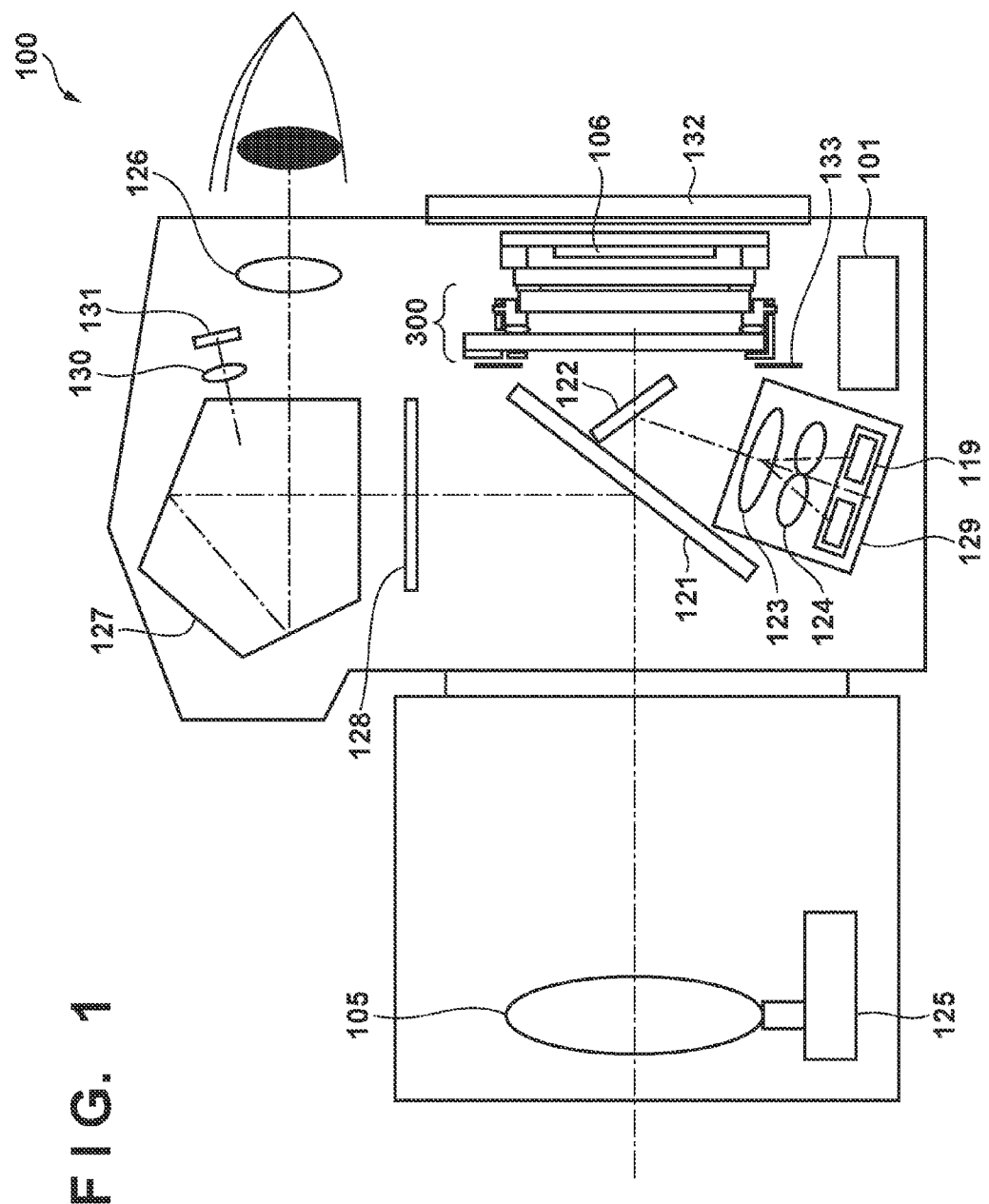
FIG. 1 is a cross-sectional view illustrating an overview configuration of a camera in an embodiment in the present invention.

FIG. 1 is a cross-sectional view that illustrates an overview configuration of a digital single-lens reflex camera 100 as an example of an image capturing apparatus in an embodiment in which the present invention is applied. A case in which a camera 100 of the present embodiment is configured from a detachable lens unit and a camera body is described, but the camera 100 may also be an integrated type camera.

An image capturing lens 105 is integrated in the lens unit which is detachable from the camera body of the camera 100. Note that the image capturing lens 105 is represented by a single lens to simplify the drawing in FIG. 1, but the image capturing lens 105 may actually be configured to include a plurality of lenses including a focus lens. In a case where a main mirror 121 and a sub mirror 122 are inserted on a light path, a portion of the light from a subject that enters the camera body via the image capturing lens 105 passes through the main mirror 121 which is semi-transmissive. Then, the light is reflected by the sub mirror 122, and is thereby guided to a publicly known phase difference focus detection unit 129. The phase difference focus detection unit 129 includes a field lens 123, a secondary imaging lens 124, and a pair of CMOS line sensors 119 for focus detection, and a region for which focus detection is possible is displayed on a viewfinder screen. By the phase difference focus detection unit 129, it is possible to detect a so-called defocus amount which indicates how much a focal point of the light from a subject formed by the image capturing lens 105 is misaligned and in what direction it is misaligned in relation to a light-receiving surface of an image sensor 106.

A CPU (central arithmetic processing device) 101 that controls operation of the camera 100 obtains an amount to drive a focus lens included in the image capturing lens 105 considering a lens drive sensitivity (a fineness of control specific to a lens) of the image capturing lens 105 in relation to the calculated defocus amount. Then, a driving amount pulse for causing an image capturing lens drive control unit 125 disposed in the lens unit to drive the focus lens is sent. The image capturing lens drive control unit 125 performs an automatic focus adjustment by driving a pulse motor in accordance with the sent pulse to drive the focus lens to an in-focus position.

Also, the light from a subject reflected by the main mirror 121 is formed on a focusing screen 128 placed in a plane that is conjugate to the imaging plane of the image sensor 106 according to the image capturing lens 105. A so-called TTL optical viewfinder configuration is taken in which the user (photographer) of the camera can observe a subject image formed on the focusing screen 128 via a pentaprism 127 and an eye piece lens 126.

Also, the subject image formed on the focusing screen 128 is formed secondarily on a photometric sensor 131, which measures the luminance of the visible light of the captured field of view, by an imaging lens 130 via the pentaprism 127. In a case where the photometric sensor 131 has a light-receiving region that is divided into 3×5, for example, it is possible to measure light having divided the main region of the field of view of the finder (field of view region) of the camera 100 into 3×5 regions.

Meanwhile, when the photographer presses a later-described release SW, the main mirror 121 and the sub mirror 122 are retracted from the light path. Also, regarding light from a subject that is concentrated by the image capturing lens 105, the amount of light from the image capturing lens 105 that reaches the image sensor 106 is controlled by a focal plane shutter 133. Next, for the light from a subject whose amount is controlled by a shutter 133, high-frequency components are attenuated and an infrared wavelength component of light flux is cut by an optical filter 300 arranged between the shutter 133 and the image sensor 106. Note that configuration of the optical filter 300 will be described below in detail.

After performing a photoelectrical conversion on the light from a subject that passes through the optical filter 300 as a subject image by the image sensor 106 which is a CMOS sensor or the like, the subject image is recorded as image data in a recording medium such as a flash memory. Meanwhile, the obtained image data is displayed on a display unit 132 comprising a TFT color liquid crystal as a captured image.

Note that a later-described on-imaging plane phase difference focus detection operation is possible using the signal outputted from the image sensor 106. For this reason it is possible to use the signal for a focus detection at a time of so-called live view capturing in which capturing is performed in a state in which the main mirror 121 and the sub mirror 122 are retracted from the light path and the focal plane shutter 133 is released. In such a case, the CPU 101 obtains an amount to drive the focus lens based on the defocus amount obtained by the on-imaging plane phase difference focus detection operation, and sends a driving amount pulse to the image capturing lens drive control unit 125.

Figure 2:
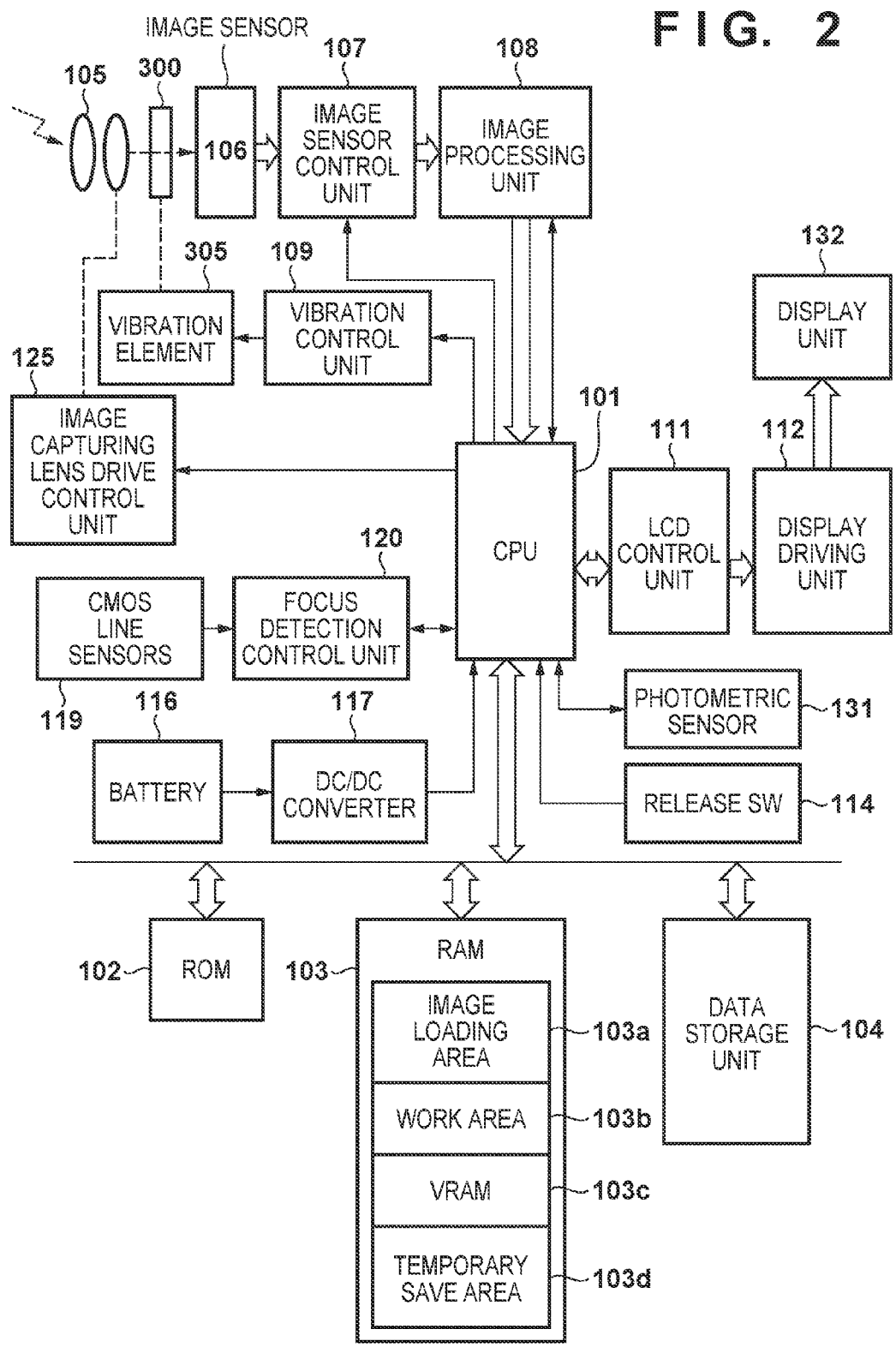
FIG. 2 is a block diagram illustrating a functional configuration of the camera according to the embodiment.

FIG. 2 is a block diagram that illustrates a functional configuration of the camera 100 illustrated in FIG. 1, and description is given assigning the same reference numerals to configuration elements that are the same as the configuration elements illustrated in FIG. 1. A ROM (read only memory) 102 in which a control program is stored, a RAM (random access memory) 103, and a data storage unit 104 are connected to the CPU 101. Additionally, an image processing unit 108, a vibration control unit 109, an LCD control unit 111, a release switch (SW) 114, a DC/DC converter 117, a focus detection control unit 120, the image capturing lens drive control unit 125, and the photometric sensor 131 are connected to the CPU 101.

An image sensor control unit 107 is connected to the image processing unit 108 and the image sensor control unit 107 is connected to the image sensor 106. It is assumed that the number of effective pixels of the image sensor 106 is approximately 20000000 (5472×3648), for example. The image sensor control unit 107 includes a timing generator for supplying a transfer clock signal and a shutter signal to the image sensor 106 and circuits for removing image sensor output signal noise and performing gain processing, and an A/D conversion circuit for converting an analog signal into a digital signal. The image processing unit 108 performs image processing such as a gamma conversion, a color space conversion, white balancing, AE, flash correction, and the like on the digital signal outputted by the image sensor control unit 107, and outputs YUV (4:2:2) format image data.

A display driving unit 112 is connected to the LCD control unit 111, and the display driving unit 112 is connected to the display unit 132. The LCD control unit 111 receives YUV digital image data transferred from the image processing unit 108 or YUV digital image data into which a JPEG image file in the data storage unit 104 is decompressed. After conversion into an RGB digital signal, processing for outputting to the display driving unit 112 is performed. The display driving unit 112 performs control for driving the display unit 132. The display unit 132 displays an image comprising approximately 920000 dots (VGA: 640×480 pixels), for example, obtained by performing conversion processing on an image that is imaged by the image sensor 106.

A vibration element 305 is configured by, for example, a piezoelectric element or the like, and is adhesively fixed to a later-described birefringent quartz plate that is arranged on the side of the image capturing lens 105 of the optical filter 300, and produces vibrations to remove foreign particles. The vibration control unit 109 includes a circuit for causing the vibration element 305 to vibrate, and the CPU 101 performs vibration control by making a command to the vibration control unit 109.

The CPU 101 performs various control based on a control program in the ROM 102. This control includes processing for reading an image signal that was outputted from the image processing unit 108 and performing a DMA transfer to the RAM 103 of the image signal, and performing a DMA transfer of data to the display driving unit 112 from the RAM 103. Also, the control includes a JPEG compression of image data and processing for storing image data in a file format in the data storage unit 104. Furthermore, the CPU 101 makes a data read pixel count and digital image processing modification instruction to the image sensor 106, the image sensor control unit 107, the image processing unit 108, the LCD control unit 111, and the like.

The focus detection control unit 120 performs an A/D conversion of voltages obtained from the pair of CMOS line sensors 119 for focus detection included in the phase difference focus detection unit 129 and sends the result to the CPU 101. Also, upon instruction by the CPU 101, the focus detection control unit 120 performs control for AGC (Auto Gain Control) and accumulation time of the CMOS line sensors 119. The CPU 101, by processing a signal sent from the focus detection control unit 120, calculates a lens driving amount for the primary subject to become focussed from a current focus detection state corresponding to the primary subject, and then makes an instruction therefor to the image capturing lens drive control unit 125. The image capturing lens drive control unit 125 can cause the main subject to focus by moving a focus lens in the image capturing lens 105 based on this instruction.

The photometric sensor 131 detects a luminance of the field of view and then sends a corresponding signal to the CPU 101. The CPU 101 calculates an exposure amount of the camera based on the intensity information, and then decides either a shutter speed or an aperture value for the image capturing lens 105 or both.

The CPU 101 controls processing for instructing an image capturing operation that accompanies operation of the release SW 114 and furthermore outputting to the DC/DC converter 117 a control signal for controlling a supply of power to each element. A battery 116 for supplying power is connected to the DC/DC converter 117. The battery 116 may be a rechargeable secondary battery or a dry cell. The DC/DC converter 117 receives a power supply from the battery 116, creates a plurality of power sources by performing a boost or a regulation, and supplies power at a voltage necessary for each element starting with the CPU 101. By this, the DC/DC converter 117, under the control of the CPU 101, can control initiation and termination of each voltage supply.

The RAM 103 comprises an image loading area 103a, a work area 103b, a VRAM 103c, and a temporary save area 103d. The image loading area 103a is used as a temporary buffer for temporarily storing a captured image (a YUV digital signal) sent from the image processing unit 108 or JPEG-compressed image data read out from the data storage unit 104. Also, the image loading area 103a is used as a work area dedicated to images for image compression processing and decompression processing. The work area 103b is a work area for various programs. A VRAM 103c is used as a VRAM in which to store display data that is displayed to the display unit 132. Also, the temporary save area 103d is used as an area for temporarily saving various data.

The data storage unit 104 is a flash memory for storing, in a file format, captured image data that is JPEG-compressed by the CPU 101 or various attached data that is referenced by an application.

The release SW 114 is a switch for instructing an initiation of an image capturing operation, and there are two switch position stages according to a pressure at which a release button (not shown) is pressed. Upon detection of a first stage position (SW1-ON), an operation for locking camera settings such as white balance, AE or the like is performed, and upon a detection of a second position (SW2-ON), an operation to read a field of view image signal is performed.

Figure 3:
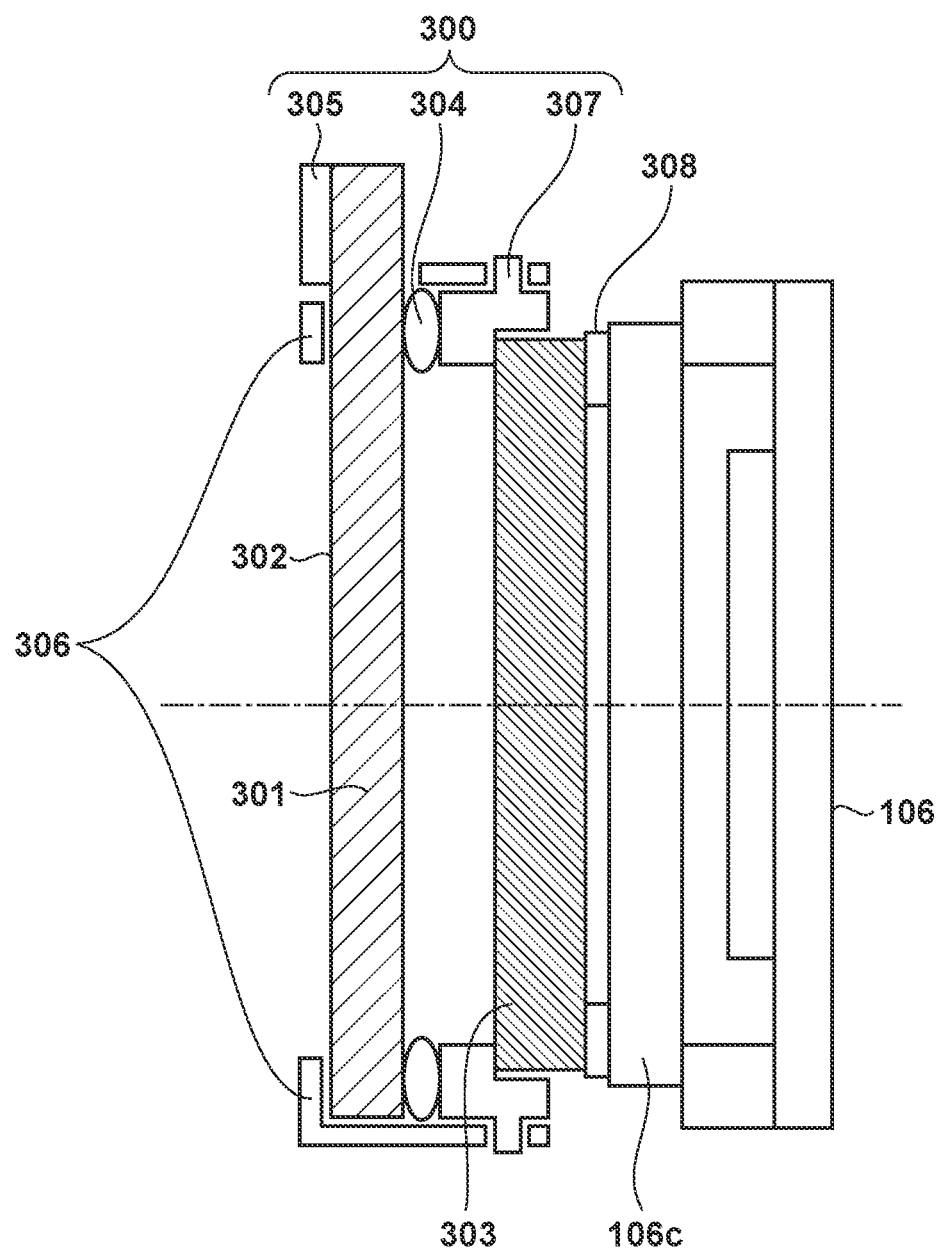
FIG. 3 is a cross-section magnification view of an optical filter and the image sensor periphery according to the embodiment.

Below, with reference to FIG. 3 and FIG. 4, detailed description of the optical filter 300 is given. FIG. 3 is a cross-sectional magnification view of the optical filter 300 and the image sensor 106 periphery. The digital single-lens reflex camera 100 of the present embodiment employs an optical low-pass filter that causes a horizontal two point separation in order to suppress the occurrence of pseudo color of the captured image in the arrangement (Bayer arrangement) of the color filters of the image sensor 106.

In an image sensor of a Bayer arrangement, it should be possible to prevent pseudo color and pseudo resolution with respect to vertical and horizontal directions of the subject by arranging an optical low-pass filter comprising two birefringent quartz plates cut at, for example, 45° in relation to a crystal axis from the crystal cluster where the cut direction is changed 0° and 90° and one quartz plate of crystal depolarizers (λ/4 plates) for eliminating polarization arranged between the two birefringent quartz plates.

However, there are many camera specifications that use a single birefringent quartz plate, in other words that only have a low-pass effect in one direction, for reasons of cost reduction or prioritization of overall resolving power. The present embodiment relates to a camera that has an optical low-pass filter comprising only one birefringence plate.

A rotation angle of a birefringent quartz plate 301 that configures the optical filter 300 here is 0°, and an optical low-pass filter that separates a light beam from the field of view into two horizontal directions is configured. An infrared absorbing filter 303 has a role of making the spectral sensitivity of the image sensor 106 approximately match the visual sensitivity of a human.

Meanwhile, the vibration element 305 which causes vibrations in the birefringent quartz plate 301 to remove foreign particles such as dust that attaches to the surface on the side of the image capturing lens 105 of the birefringent quartz plate 301 is fixed adhesively to the upper end of the birefringent quartz plate 301. The vibration element 305 is a piezoelectric device of a laminated structure in which piezoelectric bodies and internal electrodes are laminated alternatingly, and the vibration element 305 can cause a large vibrational displacement in the birefringent quartz plate 301 in a direction orthogonal to the image capturing optical axis because it produces a larger vibrational amplitude (displacement) in the lamination direction than other directions.

An elastic member 304 that is interposed between a filter holding member 307 and the birefringent quartz plate 301 is formed by an elastomer (polymer material). A pressing member 306 comprises a metal plate that has a spring characteristic, and the birefringent quartz plate 301 is held suspended in relation to the filter holding member 307 by the pressing member 306 pressing the birefringent quartz plate 301 against the elastic member 304. By this, vibration of the birefringent quartz plate 301 that follows expansion and contraction of the vibration element 305 is allowed, and scratching of the birefringent quartz plate 301 due to the vibration is prevented. At the same time, the vicinity of the four surrounding sides of the birefringent quartz plate 301 is sealed so that there is no space via the elastic member 304 with respect to the filter holding member 307. Reference numeral 308 is an adhesive sheet, and is fixed adhere securely so that dust, rubbish, and the like does not enter between a cover glass 106c which is a member for protecting the image sensor 106 and the filter unit configured by the birefringent quartz plate 301 and the infrared absorbing filter 303.

Figure 4:
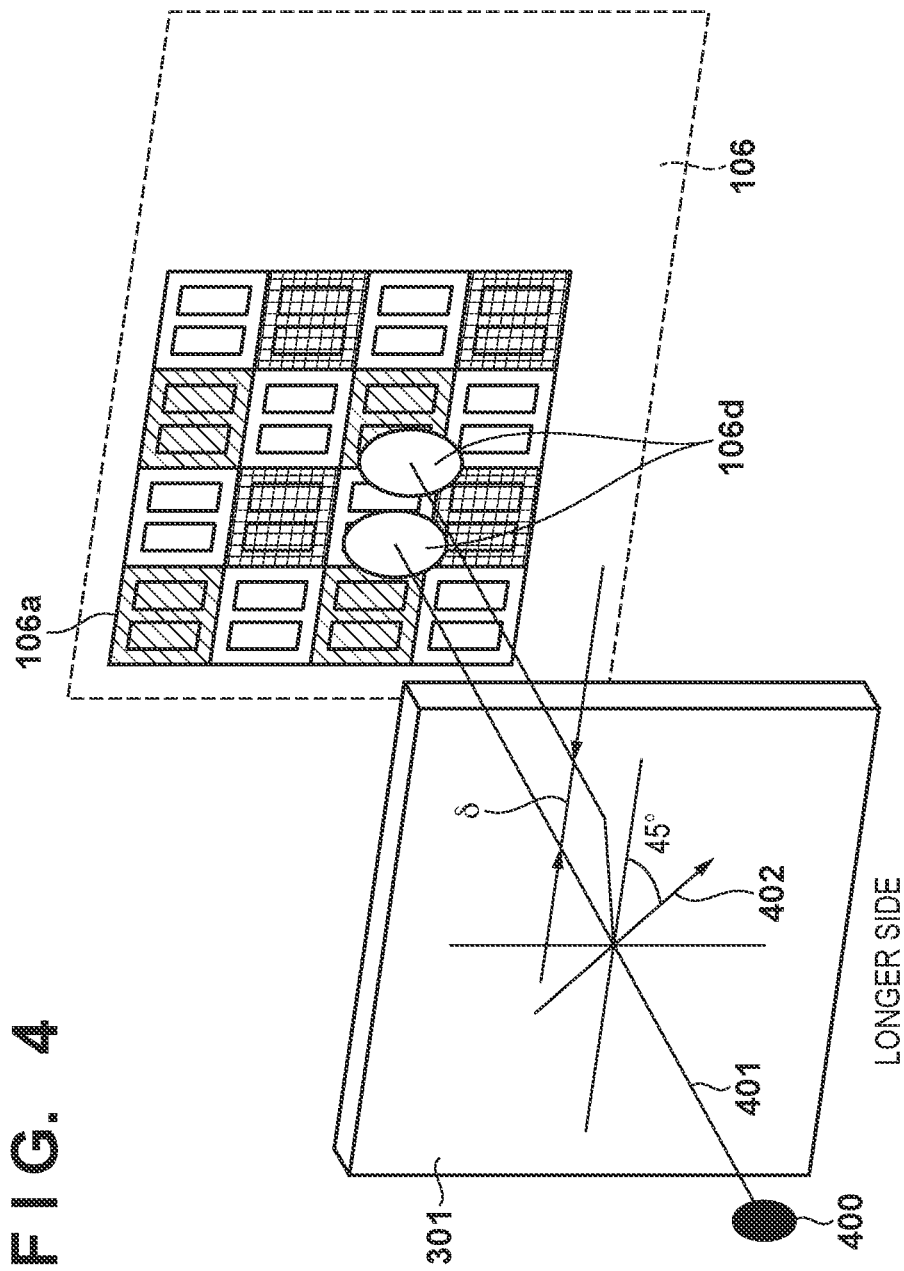
FIG. 4 is a perspective view illustrating a positional relationship between an optical filter and the image sensor according to the embodiment.

FIG. 4 is a perspective view illustrating a positional relationship between the birefringent quartz plate 301 and the image sensor 106 described in FIG. 3 and the infrared absorbing filter 303 is omitted. The birefringent quartz plate 301 is cut out such that its center axis 401 and the crystal axis 402 forming an angle of 45° and the direction of orthogonal projection of the crystal axis 402 on the birefringence quartz plate 301 and the long side direction (direction of alignment of sub-pixels) of the birefringent quartz plate 301 are parallel to each other. By this, light produced from a single light source on the subject side is separated horizontally into two: ordinary rays that pass directly through the quartz plate unchanged; and extraordinary rays that are ejected in parallel to the ordinary rays but separated therefrom by a width δ due to the birefringence effects that the crystal has. It becomes possible to control the high-frequency component cut of the spatial frequency component of the subject image in accordance with the size of this width of separation, and the birefringent quartz plate 301 functions as a so-called optical low-pass filter. When the crystal is made with a cut angle of 45° with respect to the crystal axis 402, the width δ of light beam separation due to the birefringence effects of the crystal is approximately 5.87 μm for 1 mm of crystal thickness. Therefore, from a product of this value and the thickness of the crystal the separation width necessary for producing the optimal low-pass effect can be easily attained. Specifically, letting the thickness of the crystal be t (mm), and the light beam separation width separated for each 1 (mm) of crystal thickness be h (μm), it is possible to calculate the thickness of the crystal t (mm) by using the following equation:

$$t\ (mm) = \delta/h\ (\mu m)$$

Note that it is advantageous that the separation width δ be such that δ/p<1 with respect to the pixel pitch p of the image sensor 106. This is because when δ/p=1 it means that the separated image is shifted by one entire pixel, and this is unrealistic since the image resolving power becomes substantially half.

Figure 5A:
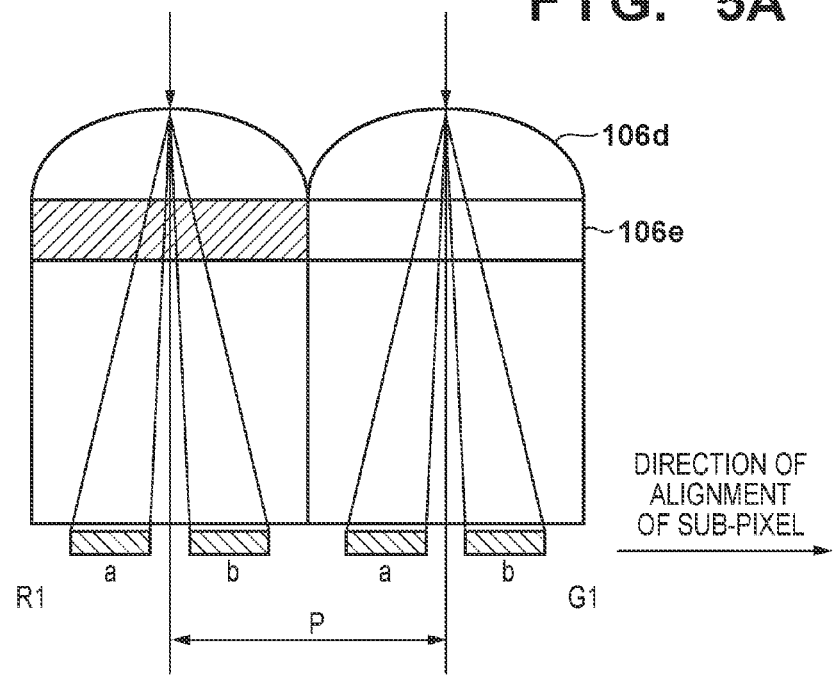
FIG. 5A and FIG. 5B are explanatory views of the image sensor according to the embodiment.
Figure 5B:
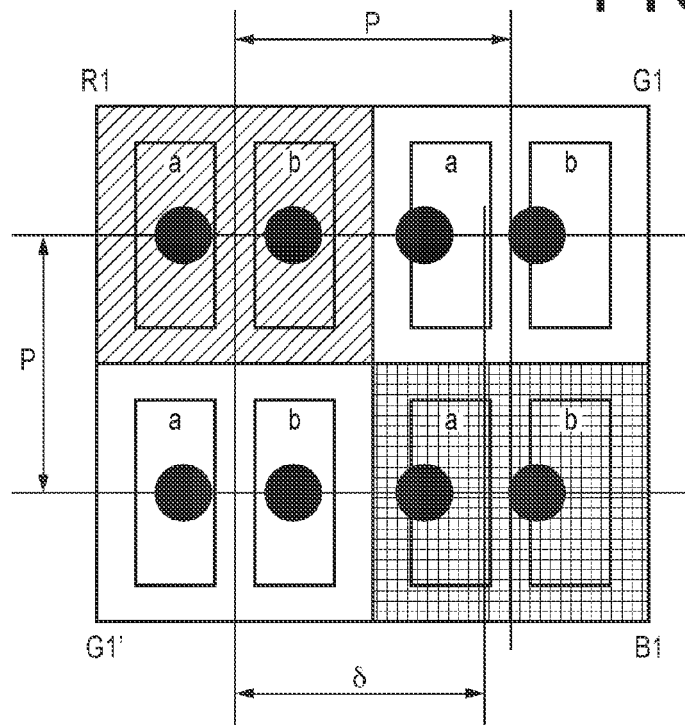

A partial magnification view of an imaging plane 106a which is a light-receiving surface of the image sensor 106 is illustrated in FIG. 5A and FIG. 5B. The imaging plane 106a is covered by an ordinary Bayer arrangement filter, and as illustrated in FIG. 5B, detects color of a subject treating a pixel R1 for detecting red, pixels G1 and G1' for detecting green, and a pixel B1 for detecting blue as a single unit. Then, color is calculated in accordance with a predetermined algorithm, and an RGB signal output is distributed for each of the R1, G1, G1', and B1 pixels. The aligned pixels illustrated in FIG. 5B are arranged across the entire surface of the imaging plane 106a.

Also, as illustrated in FIG. 5A, microlenses 106d are arranged so as to receive subject light efficiently on the front surface of each pixel. On a lower layer of the microlenses 106d, R, G, and B color filters 106e corresponding to each pixel are configured, and each pixel is further divided into two sub-pixels a and b in the horizontal direction of the camera. Because the sub-pixels a and b correspond to a pupil division of one microlens 106d, the sub-pixels a and b have respective photoelectric conversion units, and phase difference focus detection is possible by performing a correlation calculation for the signal output of each photoelectric conversion unit. The pixel structure illustrated in FIG. 5A is repeated across the entirety of the imaging plane 106a, and so fundamentally phase difference detection is possible over the entire surface of the imaging range. Note that while it is a matter of course, it is possible to generate a captured image by adding the output values from each of the photoelectric conversion units of the sub-pixels a and b for each pixel.

Light produced from a light source 400, which is a single point on the side of the subject in FIG. 4, is separated and incident on the sub-pixels a and b by the effect of the microlens 106d, as illustrated in FIG. 5A. Here, the separated points of the single point and formed on the sub-pixels a and b are referred to as sub-pixels a and b of each pixel of an image. While the interval between the sub-pixels a and b of each pixel of an image changes in accordance with the focus state of the subject image according to the image capturing lens 105, the interval between the centers of the sub-pixels a and b of each pixel of an image is the separation width δ due to the effect of the birefringent quartz plate 301. Specifically, a low-pass effect can be achieved across the R pixel, G pixel, G' pixel, and B pixel aligned consecutively horizontally, and it is possible to achieve a low-pass effect even in a horizontal focus detection phase difference signal obtained from the sub-pixels a and b of each pixel of an image sensor 106. By this effect it is possible to prevent an incorrect detection of focus detection due to a pseudo color or a pseudo resolution, and therefore it becomes possible to improve focus detection precision.

Note that an image sensing unit comprising an image sensor and an optical filter in the present invention, can be applied to any electronic device having a camera function such as a mobile phone with a camera function or a computer that has a camera, in addition to cameras such as a digital camera or a digital video camera.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-163036, filed on Aug. 23, 2016, which is hereby incorporated by reference herein in its entirety.

What is claimed is:

1. An image sensing unit that has:
an image sensor including a plurality of pixels, corresponding to a plurality of microlenses, respectively, wherein each of the pixels has a plurality of sub-pixels aligned in a predetermined direction, and that performs phase difference focus detection by performing correlation operation on pupil-divided signals divided in an alignment direction of the sub-pixels, comprising:
an optical low-pass filter arranged on a subject side of the image sensor,
wherein the optical low-pass filter is configured by a single birefringence plate, and separates a light beam in the alignment direction in which the plurality of sub-pixels are aligned, and
wherein letting a necessary light beam separation width according to a birefringence effect of the optical low-pass filter be $\delta$, and a pixel pitch of the image sensor be p, $\delta/p<1$ holds.

2. The image sensing unit according to claim 1, wherein the optical low-pass filter is a birefringent quartz plate, and a central axis of the optical low-pass filter is inclined with respect to a crystal axis, and a direction of orthogonal projection of the crystal axis on the low-pass filter and a direction of alignment of the plurality of sub-pixels are parallel to each other.

3. The image sensing unit according to claim 2, wherein letting a necessary light beam separation width according to a birefringence effect of the optical low-pass filter be $\delta$, a thickness of the optical low-pass filter be t (mm), and a light beam separation width at which separation occurs for each 1 (mm) of thickness of the optical low-pass filter be h ($\mu$m), $t$ (mm)=$\delta/h$ ($\mu$m) holds.

4. The image sensing unit according to claim 1, further comprising an excitation unit configured to vibrate the optical low-pass filter.

5. The image sensing unit according to claim 1, wherein the plurality of pixels are covered with Bayer color filters.

6. An image capturing apparatus that comprises an image sensing unit that has:
an image sensor including a plurality of pixels, corresponding to a plurality of microlenses, respectively, wherein each of the pixels has a plurality of sub-pixels aligned in a predetermined direction, and that performs phase difference focus detection by performing correlation operation on pupil-divided signals divided in an alignment direction of the sub-pixels, comprising:
an optical low-pass filter arranged on a subject side of the image sensor,
wherein the optical low-pass filter is configured by a single birefringence plate, and separates a light beam in the alignment direction in which the plurality of sub-pixels are aligned, and
wherein letting a necessary light beam separation width according to a birefringence effect of the optical low-pass filter be $\delta$, and a pixel pitch of the image sensor be p, $\delta/p<1$ holds.

7. An image sensing unit that has an image sensor including a plurality of pixels aligned in a predetermined direction, and that performs phase difference focus detection by performing correlation operation on pupil-divided signals divided in an alignment direction of the pixels, comprising:
an optical low-pass filter arranged on a subject side of the image sensor,
wherein the optical low-pass filter is configured by a single birefringence plate, and separates a light beam in the alignment direction in which the plurality of pixels are aligned, and
wherein letting a necessary light beam separation width according to a birefringence effect of the optical low-pass filter be $\delta$, and a pixel pitch of the image sensor be p, $\delta/p<1$ holds.

* * * * *